(12) United States Patent
Kerr et al.

(10) Patent No.: US 7,879,691 B2
(45) Date of Patent: Feb. 1, 2011

(54) LOW COST DIE PLACEMENT

(75) Inventors: Roger S. Kerr, Brockport, NY (US);
Timothy J. Tredwell, Fairport, NY (US); Seung-Ho Baek, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 294 days.

(21) Appl. No.: 12/236,972

(22) Filed: Sep. 24, 2008

(65) Prior Publication Data
US 2010/0072594 A1   Mar. 25, 2010

(51) Int. Cl.
*H01L 21/00* (2006.01)
(52) U.S. Cl. ...................... 438/464; 438/110
(58) Field of Classification Search ........... 438/464
See application file for complete search history.

(56) References Cited

U.S. PATENT DOCUMENTS

| | | | |
|---|---|---|---|
| 3,655,496 | A | 4/1972 | Ettre et al. |
| 4,571,826 | A | 2/1986 | Jacobs |
| 5,833,073 | A | 11/1998 | Schatz et al. |
| 6,029,427 | A | 2/2000 | Freund et al. |
| 7,195,733 | B2 | 3/2007 | Rogers et al. |
| 2004/0020036 | A1 | 2/2004 | Arneson et al. |
| 2004/0126911 | A1* | 7/2004 | Kimura ............... 438/22 |
| 2005/0005434 | A1 | 1/2005 | Arneson et al. |
| 2005/0199584 | A1 | 9/2005 | Nuzzo et al. |
| 2006/0084012 | A1 | 4/2006 | Nuzzo et al. |
| 2007/0032089 | A1 | 2/2007 | Nuzzo et al. |
| 2009/0311849 | A1* | 12/2009 | Andry et al. ............... 438/464 |

FOREIGN PATENT DOCUMENTS

| | | |
|---|---|---|
| EP | 1 326 288 A2 | 7/2003 |
| WO | WO 2004/012896 A1 | 2/2004 |
| WO | 2005122285 | 12/2005 |
| WO | WO 2006/060983 A2 | 6/2006 |
| WO | WO 2008/033680 A2 | 3/2008 |

OTHER PUBLICATIONS

Ouellette, Jennifer, "Exploiting Molecular Self-Assembly," 28 The Industrial Physicist, American Institute of Physics, Dec. 2000, 3 Pages.
Usami, Mitsuo et al., "Powder LSI: An Ultra Small RF Identification Chip for Individual Recognition Applications," 2003 IEEE International Solid-State Circuits Conference, IEEE/ISSCC 2003 Visuals Supplement, pp. 326, 327 and 579.

* cited by examiner

*Primary Examiner*—Thao X Le
*Assistant Examiner*—Kimberly Trice
(74) *Attorney, Agent, or Firm*—Nelson Adrian Blish

(57) ABSTRACT

Exemplary embodiments provide methods and systems for assembling electronic devices, such as integrated circuit (IC) chips, using a release member having a phase change material. Specifically, IC elements/components can be selectively received, stored, inspected, repaired, and/or released in a scalable manner during the assembly of IC chips by inducing phase change of the phase change material. The release member can be flexible or rigid. In some embodiments, the release member can be used for a low cost placement of the IC elements in combination with an SOI (silicon on insulator) wafer and/or an intermediate transfer member. In other embodiments, the release member can be used for a low cost placement of the IC elements in combination with a release wafer.

13 Claims, 9 Drawing Sheets

LOW COST DIE PLACEMENT

FIELD OF THE INVENTION

This invention relates generally to assembly of semiconductor devices and, more particularly, to the assembly of integrated circuit elements.

BACKGROUND OF THE INVENTION

As market demand increases for integrated circuit (IC) products such as RFID tags, and as IC die sizes shrink, high assembly throughput rates for very small die and low production costs are crucial in providing commercially-viable products. For example, the cost of an RFID device still depends on assembly complexity.

Conventional methods for assembling IC products include pick and place techniques. Such techniques involve a manipulator, such as a robot arm, to remove IC dies from a wafer and place them into a die carrier. The dies are subsequently mounted onto a substrate with other electronic components, such as antennas, capacitors, resistors, and inductors to form an electronic device. However, these techniques have drawbacks and disadvantages. For example, the pick and place techniques involve complex robotic components and control systems that handle only one die at a time. In addition, pick and place techniques have limited placement accuracy, and have a minimum die size requirement.

Thus, there is a need to overcome these and other problems of the prior art and to provide controllable methods for a scalable and low cost assembly in receiving, storing, and releasing electronic device elements.

SUMMARY OF THE INVENTION

In accordance with the present teachings, a method for assembling integrated circuits is provided.

The method can include forming one or more spaced elements on an oxide layer, the oxide layer formed on a silicon substrate; providing a release member comprising a phase-change material; joining the phase change material of the release member with the one or more spaced elements; removing the silicon substrate by etching the oxide layer; and exposing the joined phase change material to an energy for selectively releasing the one or more spaced elements from the release member.

In accordance with the present teachings, a method for assembling integrated circuits is provided.

The method can include forming one or more spaced IC elements on an oxide layer, the oxide layer formed on a silicon substrate; coupling an intermediate transfer member onto a first surface of the one or more spaced IC elements; removing the silicon substrate by etching away the oxide layer and exposing a second surface of the one or more spaced IC elements, wherein the second surface is substantially parallel to the first surface; coupling a phase change surface of a release member onto the exposed second surface of the one or more spaced IC elements; removing the intermediate transfer member from the first surface of the one or more spaced IC elements; and exposing the coupled phase change material to an energy for selectively releasing the one or more spaced IC elements from the release member.

In accordance with the present teachings, a method for assembling integrated circuits is provided.

The method can include forming a silicon layer on a phase change material of a release member; forming a plurality of bump bonds on the silicon layer of the release member; forming one or more spaced dies on the phase change material by etching through the silicon layer, wherein each spaced die comprises one or more bump bonds formed on an etched silicon layer; and exposing the phase change material to an energy to induce a phase change for selectively releasing the one or more spaced dies from the release member.

In accordance with the present teachings, a method for controlling assembly of IC elements is provided.

The method can include coupling one or more IC elements onto a phase change material of a release member; selectively inspecting a group of the one or more IC elements on the phase change material; and selectively applying an energy to a portion of the phase change material to release an inspected IC element for repair.

In accordance with the present teachings, an integrated circuit sub-assembly is provided.

The sub-assembly can include a release member supporting one or more transferred IC elements; an activatable thermal barrier layer formed on the release member, wherein the activatable thermal barrier material is provided between the one or more IC elements and the release member; and an energy source directed at said activatable thermal barrier layer, wherein said energy source activates said activatable thermal barrier layer and releases each transferred IC element from the release member.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Figure 1:
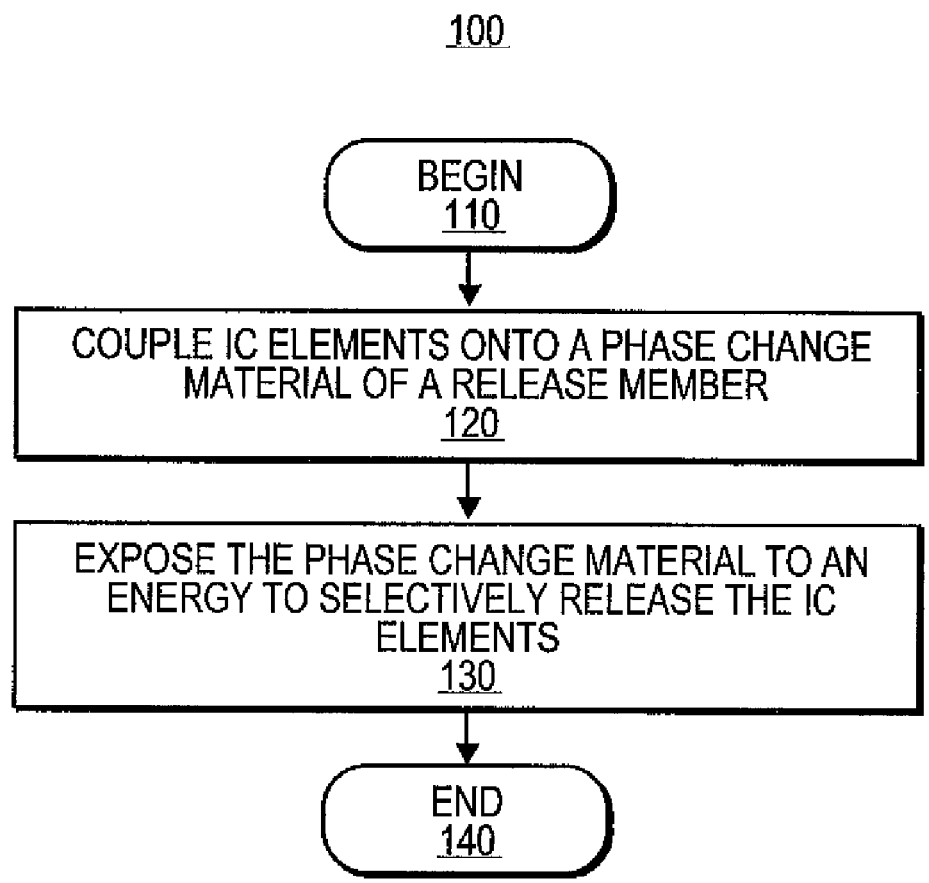
FIG. 1 depicts an exemplary method for coupling and releasing IC elements using a phase change material in accordance with the present teachings.

Reference will now be made in detail to the exemplary embodiments of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. $-1$, $-2$, $-3$, $-10$, $-20$, $-30$, etc.

Exemplary embodiments provide methods and systems for assembling electronic devices, such as integrated circuit (IC) chips. For example, IC elements/components can be selectively and scalably received, stored, inspected, repaired and released during the assembly of IC chips. As disclosed herein, exemplary IC elements can include, but are not limited to, display elements, detector elements, processor elements, or any other IC elements as would be understood by one of ordinary skill in the art.

For ease of illustration, the invention will be described with reference to an assembly of IC chips in an exemplary form of radio frequency identification (RFID) chips. RFID chips can be used in various applications, such as inventory control, airport baggage monitoring, as well as security and surveillance applications for location monitoring and real time tracking of such items. Generally, an RFID chip can include, e.g., a plurality of die elements (dies) mounted onto related electronics that can be located on a chip substrate. The plurality of dies can be an integrated circuit that performs RFID operations known to one of ordinary skill in the art, such as communicating with one or more chip readers according to various interrogation protocols of RFID.

As disclosed herein, the assembly of the exemplary RFID chips can include a low cost die placement by using a release member that has a phase-change surface. For example, in some embodiments, the die placement can include a combined use of one or more of the release member, an SOI (silicon on insulator) wafer, and an intermediate transfer member. In other embodiments, the die placement can include a combined use of the release member and a die release wafer. Even further, it will be appreciated the placement of die on a surface can be such that the die are magnetically aligned prior to subsequent processing. An example of the magnetic alignment of the die is disclosed in, for example commonly owned published application number 2006-0131504, and incorporated herein by reference in its entirety.

As used herein and unless otherwise specified, the term "release member" refers to a layered structure that includes a phase-change material formed over a release support. The term "release member" can be used to receive dies (i.e., attach dies) and, whenever desired, to release (i.e., detach) the received dies to a subsequent surface. The "release member" can be flexible or rigid and can be in a form of, for example, a web, a film, a plate, a roll, or their various combinations.

As used herein, the term "flexible" refers to the ability of a material, structure, device or device component to be deformed into a curved shape without undergoing a transformation that introduces significant strain, such as strain characterizing the failure point of a material, structure, device, or device component. The release member can therefore include, but is not limited to, a flexible web, flexible film, flexible plate, flexible sheet, flexible roll, and their various combinations. The flexibility of the disclosed release member can allow the attached IC elements to be wrapped, for example, around a mandrel and to render curved surfaces for a further storage or a roll-to-roll process.

Likewise, the release support of the release member can be flexible or rigid and can be formed with various shapes for the release member. The release support can be formed of a material including, but not limited to, glass, plastic, stainless steel, fabric, paper, a fibrous material, a tape material (as known in the art) or their various combinations. In various embodiments, the release support can be a light weight release support.

The release member can include phase-change materials. As used herein, the term "phase change materials" refers to materials that can be switched between "phases", for example, between generally amorphous and generally crystalline states. These materials can absorb energies such as optical, electrical, thermal, radiative or other energy that can induce and switch the material between its different states. The "phase-change materials" can be used as a functional interface between dissimilar materials, for example, between the release member and any IC elements. Specifically, when IC elements contact a phase-change material, the phase-change material can be adhesive to allow IC elements to be held in place, and can later allow the IC elements to be released from the release member using various energy sources, for example, optical beams from sources, such as UV, or IR lasers. When releasing, the IC elements can be transferred onto a subsequent surface and the phase-change material can be removed from the release support. Such release support (e.g., glass) can often be reused, for example, by forming (e.g., depositing) a "new" layer of phase-change material thereon to form a "new" release member. Therefore, the phase-change material can provide reworkability, ease of handling, and not require a cure in a high volume setting for IC elements.

In various embodiments, the phase change material can be designed according to the type and power of the energy sources that can be used to induce the phase change. For example, one or more metal elements can be included in the phase change material, such as, for example, tin, palladium, aluminum, silicon, germanium, tellurium, antimony, indium, silver, tellurium, antimony, gallium, lanthanide, and chalcogenide. The phase change material can therefore include various metals, metal alloys and/or metal compounds of a combination to trip at a predetermined temperature to conduct the phase change. Tolerances of ±1-2° C. can be obtained. For example, metal compounds can include compounds of Ga, La, and S (GLS), as well as related compounds in which there is substitution of S with O, Se and/or Te.

By using the phase-change material, the release member can be used to receive IC elements, and to further release IC elements to any desired subsequent receiving surface (e.g., an intermediate transfer type surface or a final chip surface). In addition, the release member can be used to store the received IC elements in various flexible or rigid forms. For example, the release member can be used for a display including, but not limited to, TV screen, radiographic detector, and/or sensor array. Such display can be flat or arcuate, and can be used, e.g., to emit, detect and/or collect energy.

FIG. 1, FIGS. 2A-2C and FIGS. 3A-3C depict various embodiments for transferring IC elements using a release member having a phase change surface in accordance with the present teachings. Specifically, FIG. 1 depicts an exemplary method 100 for coupling and releasing IC elements using the release member, while FIGS. 2A-2C and FIGS. 3A-3C depict various exemplary embodiments for assembling IC elements at various stages based on the method 100 depicted in FIG. 1. Although the method 100 will be described in reference to FIGS. 2A-2C and/or FIGS. 3A-3C for illustrative purposes, the process of method 100 is not limited to the structures shown in FIGS. 2A-2C and FIGS. 3A-3C.

The method 100 begins at 110 in FIG. 1. At 120, IC elements can be coupled with a release member through a phase change material formed on a release support. For example, a plurality of RFID dies can be coupled with the release member at the surface of the phase change material. In various embodiments, the phase change material can be patterned on the release support of the release member. Each patterned phase change material can be selectively used to couple one of the plurality of RFID dies.

Each exemplary RFID die can further include a plurality of contacts to provide an electrical connection of the RFID die with the related electronics for the RFID chips. The plurality of contacts can include, for example, conductive traces, such as conductive ink traces, or conductive bumps or bumps attached to a strap. In various embodiments, the exemplary conductive bumps can be formed on a die support, such as silicon. The conductive bumps can further be built up, if required by the assembly process, by the deposition of additional materials, such as gold and solder flux. Such "bumping" processes are known to one of ordinary skill in the relevant arts.

The plurality of dies (e.g., wherein each die includes a plurality bumps) can therefore be mounted in either a "bump side up" or "bump side down" orientation. As used herein the terms "bump side up" and "bump side down" denote alternative implementations of the plurality of dies. In particular, these terms designate the orientation of connection bumps in relation to a subsequent surface, such as a chip substrate. That is, in a "bump side up" orientation, the plurality of dies can be transferred to the subsequent surface with bumps facing away from the subsequent surface. In a "bump side down" orientation, the plurality of dies can be transferred to the subsequent surface with bumps facing towards, and in contact with the subsequent surface.

In various embodiments, the subsequent surface can be an intermediate transfer surface, or an actual final chip substrate to which the dies can be permanently attached. If the subsequent surface is not a final surface, the plurality of dies can be transferred to an intermediate surface, such as the surface of an intermediate transfer member as disclosed herein. In various embodiments, the subsequent surface can be rigid or flexible and can be formed from various materials chosen from, for example, plastic, fibrous material, glass, silicon wafer, etc., for either the intermediate surface or final chip substrate.

Figure 2A:
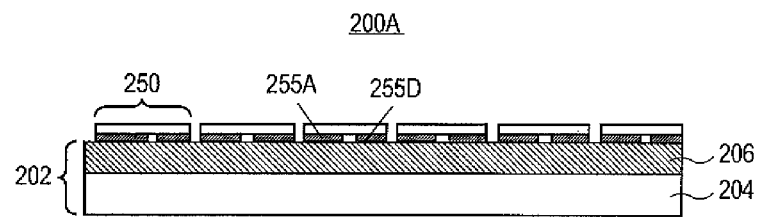
FIGS. 2A-2C depict an exemplary embodiment for assembling IC elements at various stages based on the method depicted in FIG. 1 in accordance with the present teachings.

For example, in FIG. 2A, device 200A can allow for a "bump side up" release. As shown, the device 200A can include a plurality of dies 250 formed on a release member 202 that can include a phase-change material 206 formed on a release support 204. Each die 250 can include a plurality of bumps 255a-d.

Figure 3A:
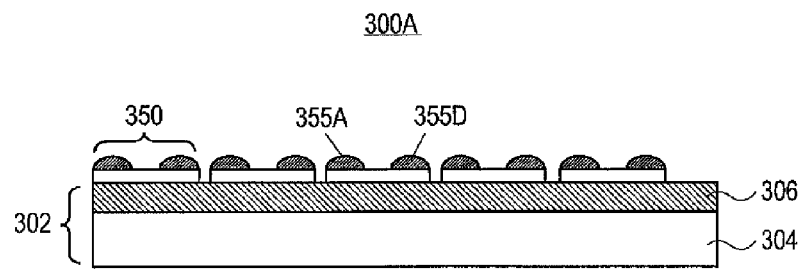
FIGS. 3A-3D depict another exemplary embodiment for assembling IC elements at various stages based on the method depicted in FIG. 1 in accordance with the present teachings.

In another example, as shown in FIG. 3A, device 300A can allow for a "bump side down" release. As shown, the device 300A can include a plurality of dies 350 formed on a release member 302, wherein each die 350 can include a plurality of bumps 355a-d, and the release member 302 can include a phase-change material 306 formed on a release support 304.

Note that the plurality of bumps 255a-d in device 200A and the plurality of bumps 355a-d in device 300A are shown in a cross section view, wherein contact bumps 255a-d and/or 355a-d can be arranged in a rectangular shape that allows for flexibility in die placement, and good mechanical adherence between surfaces. In various embodiments, any number of contact bumps can be formed for devices 200A and 300A, depending on a particular application. In addition, contact bumps 255a-d and/or 355a-d can be laid out in other shapes in accordance with the present teachings.

Referring back to FIG. 1, at 130, the release member that is coupled with IC elements can be exposed to an energy source to induce a phase change of the phase-change material, and thus to release the IC elements from the release member leaving the release support to be, for example, reused. And the method 100 concludes at 140.

Figure 2B:
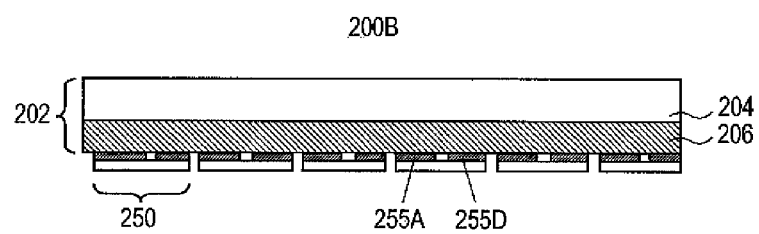

In the first exemplary embodiment of the method 100, as shown in FIG. 2A, in order to release the plurality of dies 250, the device 200A can be flipped upside down to have the bumps 255 face "up" with respect to the die 250 as shown in FIG. 2B. The device 200B can then be placed close to a subsequent surface 290 and/or in contact with the subsequent surface 290 as shown in FIG. 2C.

Figure 3B:
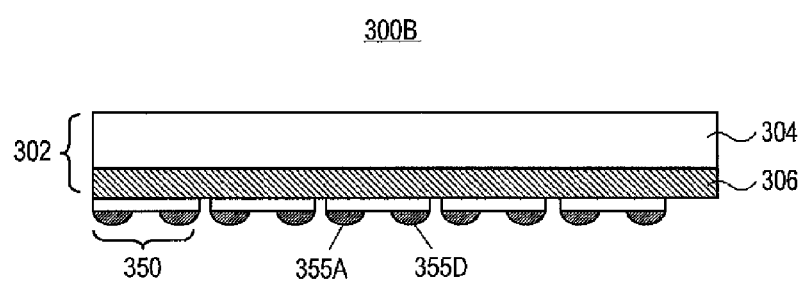
Figure 3C:
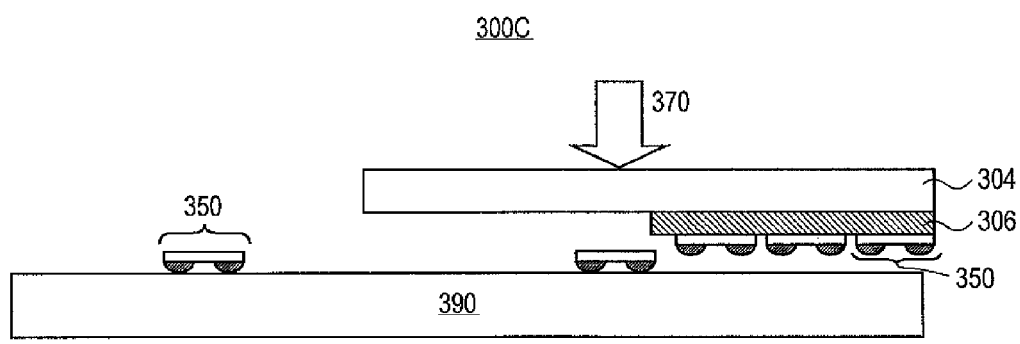

In the second exemplary embodiment of the method 100, as shown in FIG. 3A, in order to release the plurality of dies 350 in FIG. 3A, the device 300A can be flipped upside down to have the bumps 355 face "down" with respect to the die 350 as shown in FIG. 3B. The device 300B can then be placed close to and/or in contact with a subsequent surface 390 as shown in FIG. 3C.

The device 200B (see FIG. 2B) and the device 300B (see FIG. 3B) can then be exposed to an energy to induce a phase change of the phase-change material (e.g., 206 or 306) of the release member (e.g., 202 or 302). Because of the induced phase change, the plurality of dies can be released from the release member (202 or 302) (e.g., onto a prepared subsequent surface 290 or 390). In various embodiments, the energy source can be, for example, an optical source such as a laser beam of UV or IR. In the case when an optical energy is used, the release member (e.g., 202 or 302), including the release support (e.g., 204 or 304) can be at least partially transparent in order to transmit the optical signal onto the phase change material (e.g., 206 or 306).

Figure 2C:
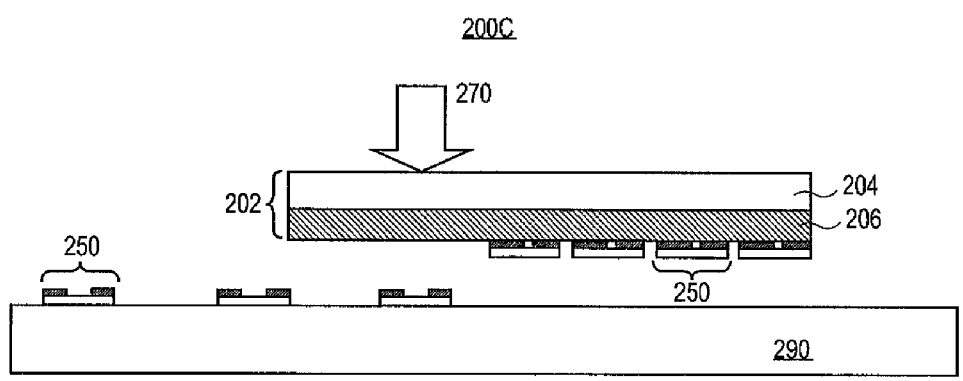

Specifically, in FIG. 2C, the device 200C can be exposed to, e.g., an IR laser beam 270. When the IR laser beam 270 hits the phase-change material 206 of the release member 202, the phase-change material 206 can absorb this laser energy by design and induce a phase change between its different states to release each of the plurality of dies 250 from the device 200B (i.e., from the release support 204) to the subsequent surface 290. Similarly, in FIG. 3C, the device 300C can be exposed to, e.g., an IR laser beam 370. When the IR laser beam 370 hits the phase-change material 306 of the release member 302, the phase-change material 306 can absorb this laser energy by design and induce a phase change between its different states to release each of the plurality of dies 350 from the device 300B (i.e., from the release support 304) to the subsequent surface 390.

The subsequent surface 290 or 390 can include an adhesive substance (not shown) formed on a substrate of the subsequent surface. The adhesive substance can be known to one of ordinary skill in the art and can be sufficient to hold the released elements in place on the subsequent surface and can also be easily transported carrying the attached IC elements. The subsequent surface can be an intermediate substrate and/or a final chip substrate.

In various embodiments, prior to releasing, the subsequent surface 290 or 390 can be placed in contact with the die elements and be pressed against the die elements that reside on the release member (e.g., 202 in FIG. 2C or 302 in FIG. 3C) causing the elements to attach to the adhesively coated subsequent surface. When exposed to releasing energy, the phase change material (e.g., 206 or 306) can undergo a phase change to release the die elements and can be removed, leaving the dies 250 or 350 attached to the subsequent surface (e.g. 290 or 390). In various embodiments, a conductive metal coating having, for example, a plastic or dielectric overlay can be formed on the subsequent surface, the metal coating electrically connecting with the bump bonds 355.

Figure 3D:
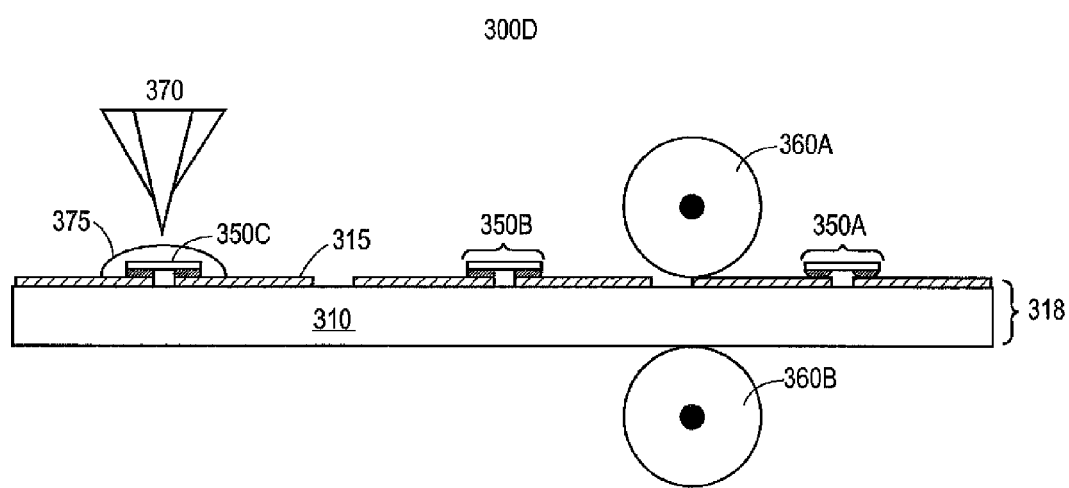

In addition to that disclosed in connection with FIGS. 3A-3C, the exemplary embodiment 300D depicted in FIG. 3D, indicates that one or more released IC elements 350 can be transferred onto an exemplary antenna substrate 318 or otherwise metal coated substrate 318.

The released (i.e., detached) one or more dies 350, e.g., 350B and 350C shown in FIG. 3D, transferred onto the antenna substrate 318 can have an electrically conductive contact with a plurality of antennas 315 through a plurality of bump bonds 355 of each transferred die 350B or 350C.

In various embodiments, a conductive adhesive or an activatable thermal barrier layer can be disposed between the antenna 315 of the chip substrate 310 and the bump bonds 355 of each die 350B or 350C.

As shown in FIG. 3D, the transferred dies can be bonded with the antenna substrate 318 by using various application rollers 360 A/B to form bonded dies (e.g., 350B or 350C) on the antenna substrate 318.

In one embodiment, at least one pressure roller such as 360A can be used to apply pressure to each transferred die 350 to provide a compressive pressure for bonding the bump bonds 355 of the die 350 with the underlying antenna substrate 318. In various embodiments, more pressure rollers can be used. For example, a second pressure roller, feed, or idler roller 360B can oppose the roller 360A and be positioned on an opposite side of the chip substrate 310 to assist in bonding each die (e.g., 350 B/C) with the antenna substrate 318.

In another embodiment, at least one heating roller 360A can be used to roll over each transferred die 350 to provide a thermal energy for bonding each transferred die with the underlying antenna substrate 318. In various embodiments, more heating rollers can be used. For example, a second heating roller, feed, or idler roller 360B can oppose the roller 360A and be positioned on an opposite side of the chip substrate 310 to assist in bonding each die (e.g., 350 B/C) with the antenna substrate 318.

In an additional embodiment, each transferred die 350 can be bonded with the underlying antenna substrate 318 by applying both a compressive pressure and thermal energy using one or more of an exemplary roller 360A and an exemplary roller 360B. In addition, the compressive pressure and the heat can be applied by, for example, one or more pressure rollers and one or more heating rollers. In the event of multiple rollers formed in series, pressure and heat can then be applied either sequentially or simultaneously according to a positioning of rollers.

Subsequently, the bonded IC elements on the antenna substrate can be encapsulated in place using an encapsulating material, which can be a curable material including, but not limited to, polyurethane, polyethylene, polypropylene, polystyrene, polyester, and epoxy, and combinations thereof. The encapsulating material can be generally deposited over electronic components (e.g., dies 350B or 350C in FIG. 3D) mounted on a chip substrate (e.g., the antenna substrate 318) using, for example, a syringe-type dispenser moved over the chip substrate. For example, dams (e.g., 375 in FIG. 3D) of high viscosity encapsulating material 380 can be first deposited around areas where components are bonded and then the areas within the dams can be cured by, for example, applying pressure, heat or radiation depending on the chosen encapsulating material. As still shown in FIG. 3D, the exemplary bonded die 350C can be locked in place on the antenna substrate 318 within the cured encapsulating material 375.

In various embodiments, the acts of releasing, transferring, bonding, and encapsulating of the one or more IC elements illustrated in FIG. 3D can be performed simultaneously in a successive manner using, for example, a flexible sheet to sheet process or flexible roll to roll process. In this manner, a large amount of dies can be released, transferred, bonded and encapsulated selectively, successively, and simultaneously.

It is noted that the method 100 and the processes 200 and 300 can be implemented on any portion of, or all of the dies on the release member. For example, the method and processes can be accomplished in one or more iterations, using one or more strips of an adhesive coated on the subsequent substrate that each adhere to and carry away a group of dies from the release member. Alternatively, a sheet sized adhesive coated subsequent surface can be used to adhere to and carry away multiple groups or any size array of the dies from the release member.

In this manner, as described in FIGS. 1-3, the disclosed release member can provide a "controllable" technique for selectively receiving, storing, screening (inspecting), repairing, and/or releasing IC elements. First, the release member can provide a scalable high volume assembly of IC elements. For example, when glass is used for the release member, a glass release member can be formed having dimensions on an order of meters (e.g., about 2×2 square meters) or larger, while a traditional silicon wafer generally has a maximum diameter of, for example, about 8 inches. Second, the release member can have various flexible (e.g., curved) shapes and provide conformability for storing or further usage. Third, by using the release member, the assembly process of IC elements can be controlled. That is, a selective inspection and/or a selective repair can be performed prior to releasing of the IC elements from the release member. For example, a group of the IC elements on the phase change material can be selectively inspected using a test circuit based on specific applications. An inspected IC element that needs to be repaired can then be determined and selectively released from the release member by applying energy to a selected portion of the phase change material, to which the determined IC element is coupled. Fourth, when releasing, by using the phase change material, one or more selected IC elements or multiple IC elements can be released at a time. In addition, the disclosed releasing process of the IC elements can be performed continuously for all of the IC elements at a time or flexibly for a portion of the IC elements at a time. Finally, the geometry and distribution of the released IC elements can be selectively changed when transferring to the subsequent surface after releasing.

In various embodiments, the method 100 can be used to transfer IC elements between any two surfaces during the IC processes by using the phase change material on various surfaces. The transfer between any two surfaces can include, for example, transferring IC elements from a release member to an intermediate surface, transferring IC elements between multiple intermediate surfaces, transferring IC elements between an intermediate surface and the final substrate surface, and transferring IC elements from the release member to the final substrate surface.

In addition, the method 100 can be applicable and employed for a desired bump side up release or bump side down release according to a particular application. In various embodiments, the release member of the method 100 can be used in combination with an intermediate transfer member, an SOI wafer, and/or a release wafer for a desired release.

FIG. 4 and FIGS. 5A-5D, FIG. 6 and FIGS. 7A-7E depict various embodiments for releasing IC elements using the release member in accordance with the present teachings. For example, FIG. 4 and FIGS. 5A-5D, as well as FIG. 6 and FIGS. 7A-7E show methods and processes for releasing IC elements using an SOI wafer and/or intermediate transfer member in accordance with the present teachings.

Figure 4:
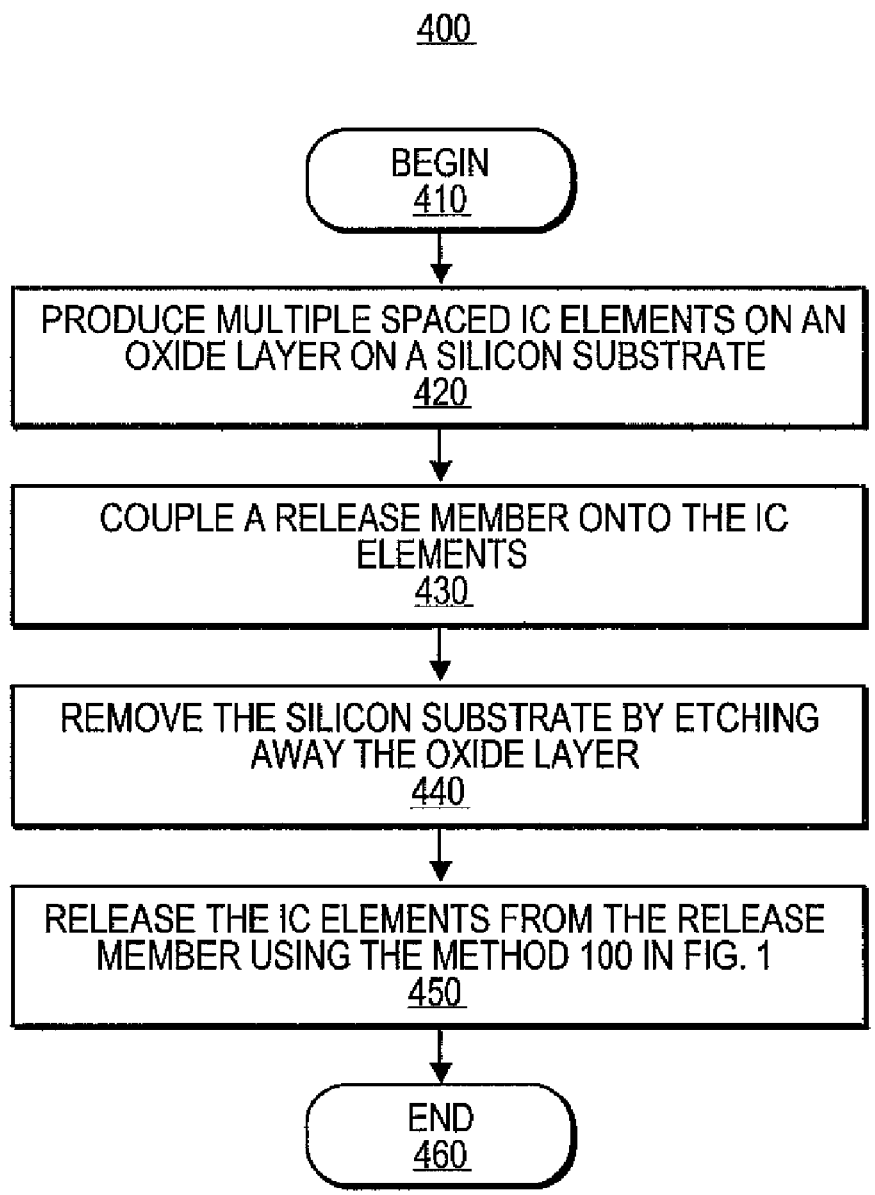
FIG. 4 depicts an exemplary method for assembling IC elements using a phase change material and silicon on insulator (SOI) wafer in accordance with the present teachings.

Specifically, FIG. 4 depicts an exemplary method 400 for receiving and releasing IC elements using an SOI wafer and a release member, while FIGS. 5A-5D depict an exemplary process based on the method 400 in FIG. 4 in accordance with the present teachings. Although the method 400 will be described in reference to FIGS. 5A-5D for illustrative purposes, the process of method 400 is not limited to the structures shown in FIGS. 5A-5D.

Beginning at 410 of the method 400, at 420, multiple spaced IC elements can be produced on an oxide insulator layer that is disposed on a silicon substrate. In various embodiments, an SOI wafer can be used to form the multiple separated die elements.

Figure 5A:
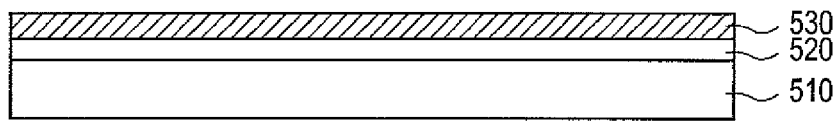
FIGS. 5A-5D depict an exemplary assembly process based on the method depicted in FIG. 4 in accordance with the present teachings.
Figure 5B:
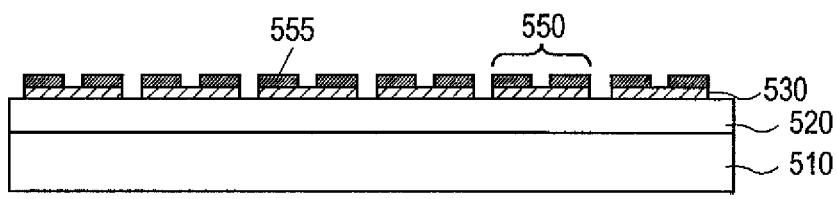

For example, as shown in FIG. 5A, the device 500A can include a silicon substrate 510 having an overlying oxide insulator 520 and a thin silicon semiconductor layer 530 formed above the oxide layer 520. The upper thin silicon layer 530 can have a thickness of about 5 microns or less by, for example, removing/etching a portion of silicon from an upper silicon layer of an SOI wafer as is recognized in the art.

IC elements can then be formed from the thin silicon layer 530 of the device 500A. For example, a plurality of bumps 555 can be formed on the thin silicon layer 530 to form a plurality of dies 550. The plurality of dies 550 can be further separated from one another on the oxide layer 520 (see device 500B of FIG. 5B). The separation between the dies 550 can be performed by suitable patterning and etching processes known to one of ordinary skill in the art to remove portions of silicon (that are located between any two adjacent dies 550) through the thin silicon layer 530.

At 430 in FIG. 4, a release member can then be coupled with the multiple separated IC elements (e.g., dies) by laminating the phase change material of the release member onto the surface (defined as "first surface") of the exemplary multiple die elements.

Figure 5C:
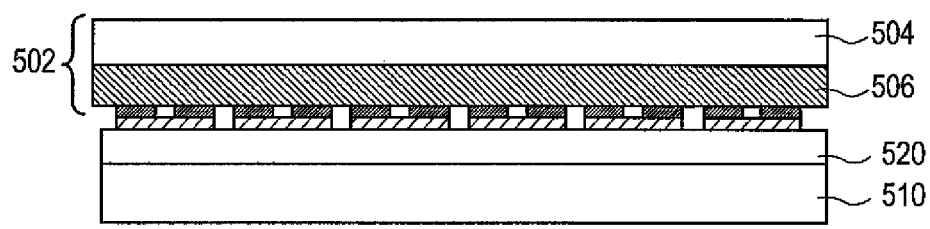
Figure 5D:
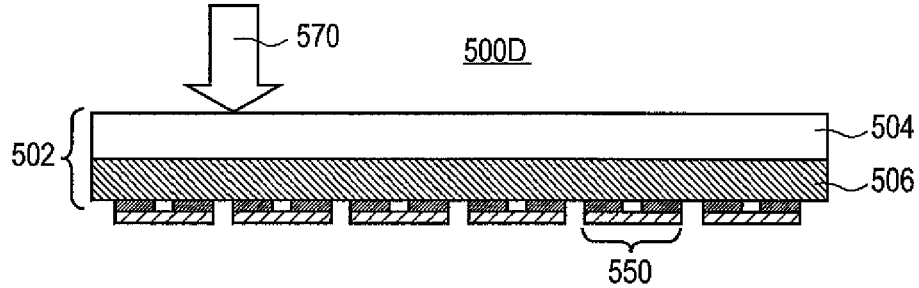

As shown in FIG. 5C, a release member 502 can be positioned in contact with a first surface of the device 500B that has a plurality of dies 550. For example, the phase-change material 506 of the release member 502 can contact the plurality of dies 550 and hold the plurality of dies 550 in place as shown in FIG. 5C.

At 440, the silicon substrate can then be removed by etching away the oxide insulator layer that is disposed between the multiple separated IC elements and the silicon substrate. For example, as in FIGS. 5C-5D, the silicon substrate 510 can be removed by etching away the oxide layer 520 using suitable etching techniques known to one of ordinary skill in the art and exposing a second surface of the plurality of dies 550. Consequently, the device 500D can include the release member 502 attached on the first surface of the plurality of dies 550, which dies can be subsequently released, for example, onto an intermediate or final substrate, in a bump side up manner.

At 450 of FIG. 4, the device (e.g., 500D), having a similar structure as that shown in FIG. 2B, can be processed by using the method 100 as described in FIG. 1 and/or FIGS. 2B-2C. For example, the device 500D can be exposed to an energy beam 570 to induce the phase change of the phase change material 506 and further to release the plurality of dies 550 from the release member 502. As similarly described in FIGS. 2-3, the released plurality of dies 550 can be transferred onto a subsequent surface for further processes depending on various specific applications. The method 400 concludes at 460 for further processes as known in the art.

Figure 6:
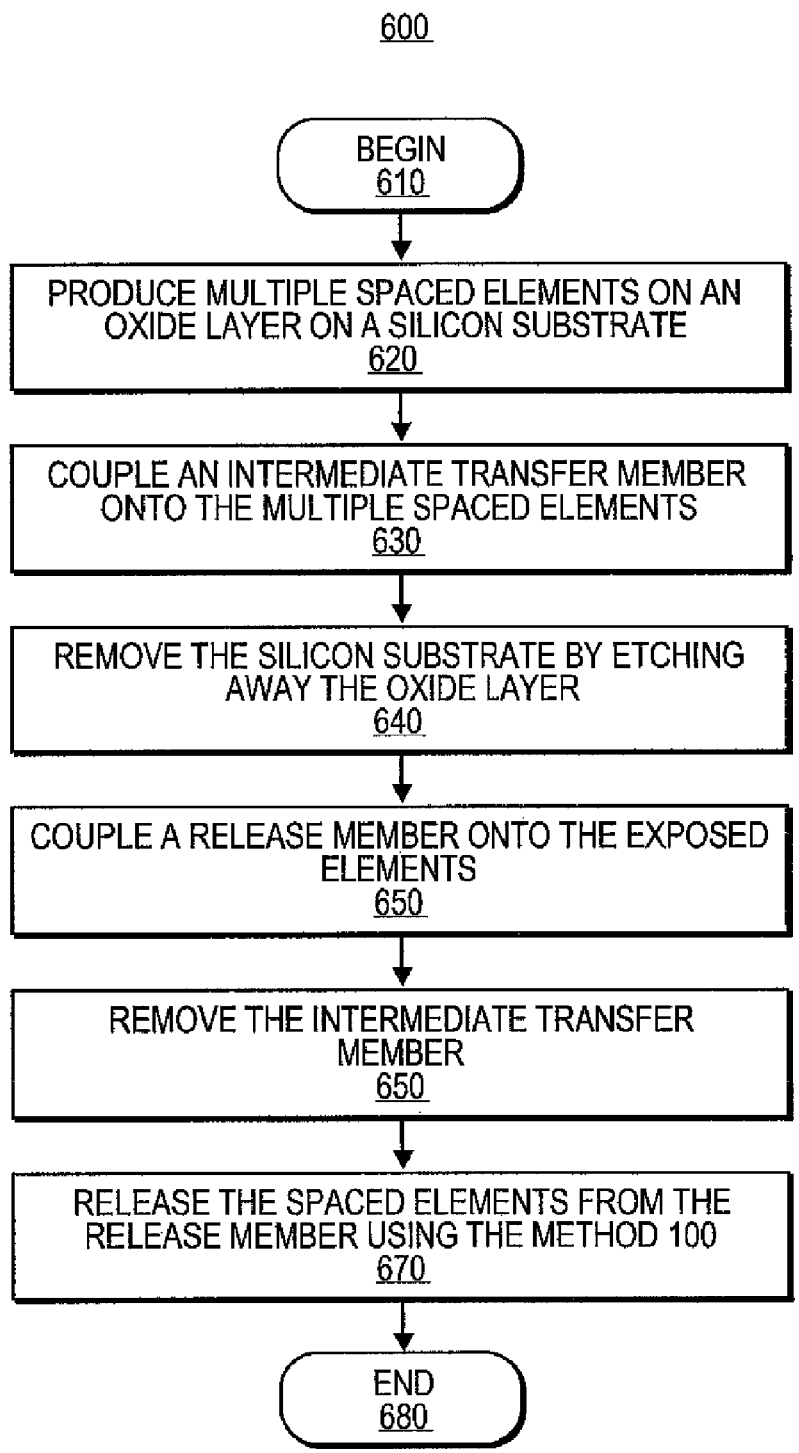
FIG. 6 depicts another exemplary method for assembling IC elements using a phase change material, an SOI wafer and an intermediate transfer member in accordance with the present teachings.

FIG. 6 depicts another exemplary method 600 for receiving and releasing IC elements using an SOI wafer and an intermediate transfer member in accordance with the present teachings. For illustrative purposes, the method 600 will be described in reference to FIGS. 7A-7E, although the method 600 is not limited to the structures shown in FIGS. 7A-7E.

The method 600 begins at 610. At 620, one or more spaced IC elements can be formed on an oxide layer that is formed on a silicon substrate. In various embodiments, the one or more spaced IC elements can be formed from the upper silicon layer of an SOI wafer as is known to one of ordinary skill in the art.

Figure 7A:
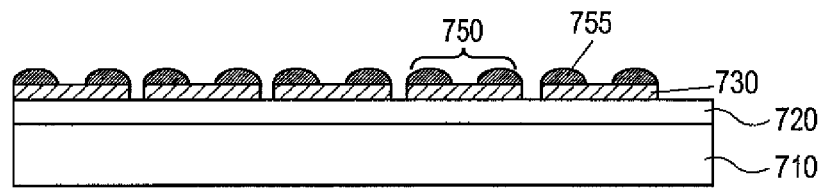
FIGS. 7A-7E depict an exemplary assembly process based on the method depicted in FIG. 6 in accordance with the present teachings.

For example, as shown in FIG. 7A, a plurality of separated die elements 750 can be formed on an oxide layer 720 on a silicon substrate 710. Each die element 750 can include a plurality of bumps 755 formed on a portion of a thin silicon layer 730. Each portion of the thin silicon layer 730 can be formed by etching through an upper silicon layer that is formed on an oxide layer 720 on a silicon substrate 710, for example, of an SOI wafer. The thin silicon layer 730 can have a thickness of, for example, about 5 microns.

At 630 in FIG. 6, an intermediate transfer member can be attached to the (first) surface of the one or more IC elements that is formed on the oxide layer of the exemplary SOI wafer.

Figure 7B:
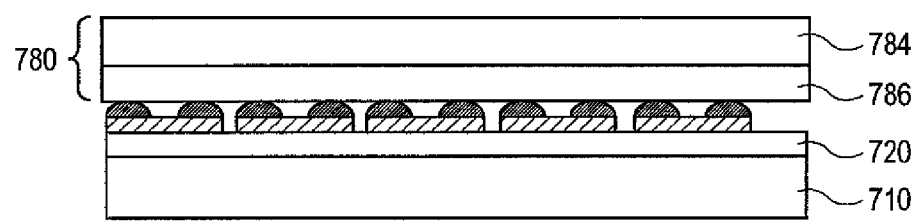
Figure 7C:

As shown in FIG. 7B, an intermediate transfer member 780 can be positioned to couple with a first surface of the device 700A (see FIG. 7A) that has a plurality of dies 750 attached thereto. The intermediate transfer member 780 can be rigid or flexible to receive, release and/or transfer the plurality of dies 750. The intermediate transfer member 780 can include an adhesive surface 786 formed on a transfer support 784. In various embodiments, the transfer support 784 can be similar to the release support (e.g., 204 in FIG. 2, 304 in FIG. 3, or 504 in FIG. 5) used for the disclosed release member (e.g., 202 in FIG. 2, 302 in FIG. 3, or 502 in FIG. 5). In other embodiments, the transfer support 784 can use different materials from the release support of the release member. In yet other embodiments, the transfer support 784 can be flexible. The adhesive surface 786 can include one or more adhesive materials, such as, for example, an epoxy, glue, or wax applied thereto, to provide surface adhesiveness. In various embodiments, the intermediate transfer member 780 can be, for example, a green tape or a blue tape as known in the industry. In one embodiment when coupling, the intermediate transfer member 780 can be pressed against the plurality of separated dies 750 causing the dies 750 to attach thereto. The intermediate transfer member 780 can be moved away with the attached dies 750.

At 640, the silicon substrate can be removed by etching away the overlaying oxide layer and exposing a second surface of the one or more spaced IC elements.

For example, as shown in FIG. 7B, the silicon substrate 710 can be removed by etching away the oxide layer 720 using suitable etching techniques known to one of ordinary skill in the art. This removal of the silicon substrate 710 and the oxide layer 720 can expose a second surface that is substantially parallel to the first surface of the plurality of dies 750 (see device 700C in FIG. 7C). Consequently, the device 700C can include an intermediate transfer member 780 attached to the first surface of the plurality of dies 750.

At 650, a release member having a phase change material formed on a release support can be provided. The phase change material can then be attached to the exposed second surface of the plurality of dies 750.

Figure 7D:
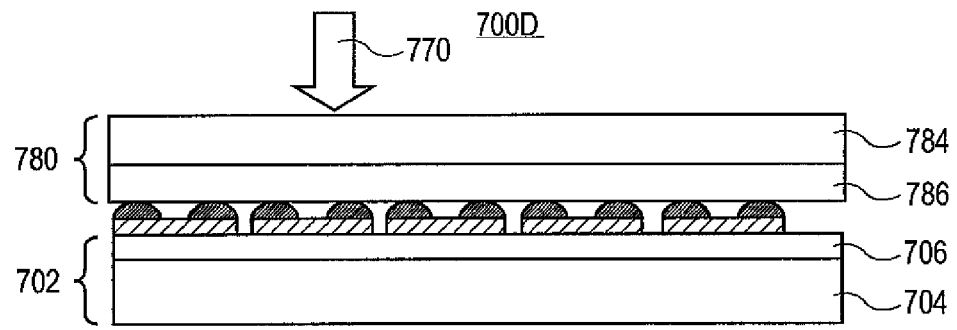

As shown in FIG. 7D, a release member 702 can be attached onto the second surface of the plurality of dies 750 (see device 700C), wherein the second surface of the plurality of dies 750 joins and adheres with the phase-change material 706, and subsequently can be released via an energy exposure as shown at 770.

At 660, the intermediate transfer member can be removed leaving the one or more IC elements attached to the release member.

Figure 7E:
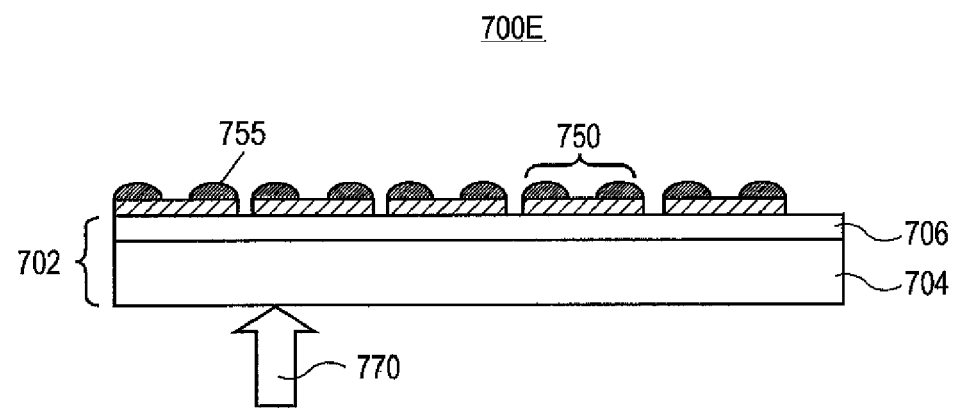

As shown in FIG. 7E, the intermediate transfer member 780 can be removed from the first surface of the plurality of dies 750 and the bump bonds 755 of each die 750 can be exposed (see FIG. 7E). As shown, the device 700E can be similar to the device 300A of FIG. 3A.

At 670, the one or more IC elements can then be released from the release member by applying an energy source to the phase-change material disposed between the one or more IC elements and the release support of the release member.

For example, as similarly described in FIG. 1 and FIGS. 3B-3C, the device 700E can be flipped upside-down for a further releasing process, which can be, for example, a bump side down release. In an exemplary embodiment, the flipped device 700E can be exposed to an energy beam 770 to induce the phase change of the phase change material 706 and further to release the plurality of dies 750 from the release member 702. The released plurality of dies 750 can then be transferred onto a subsequent surface for further processes depending on various specific applications as described in FIG. 1.

The method 600 concludes at 680. In various embodiments, the method and process in FIG. 6 and FIGS. 7B-7E can be repeated as desired to receive, release and transfer IC elements. For example, the plurality of dies 750 can be transferred to any two surfaces for either a bump side up or a bump side down orientation by using one or more intermediate transfer members 780 and at least one release member 702.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for assembling integrated circuits comprising:
   forming one or more spaced elements on an oxide layer, the oxide layer formed on a silicon substrate;
   providing a release member comprising a phase-change material;
   joining the phase change material of the release member with the one or more spaced elements;
   removing the silicon substrate by etching the oxide layer; and
   exposing the joined phase change material to an energy for selectively releasing the one or more spaced elements from the release member.

2. The method of claim 1, wherein the energy is generated by a UV laser or an IR laser.

3. The method of claim 1, wherein the release member is at least partially transparent.

4. The method of claim 1, wherein the release member comprises one or more patterned phase-change materials, and further joining each patterned phase change material of the release member with one of the one or more spaced elements.

5. The method of claim 4, wherein the release member comprises a roll-to-roll material.

6. The method of claim 1, wherein the release member comprises a roll-to-roll material.

7. The method of claim 1, further comprising:
   transferring the one or more released elements to a chip substrate, wherein each transferred element is positioned in electrical contact with the chip substrate;
   bonding each transferred element onto the chip substrate, wherein bonding each transferred element comprises one or more processes of applying pressure and heat to bond each transferred element onto the chip substrate; and
   encapsulating each bonded element in an encapsulating material.

8. The method of claim 7, wherein the bonding comprises using at least one pressure roller in contact with each transferred element and at least one heat roller in surface contact with the chip substrate to bond the transferred elements onto the chip substrate.

9. The method of claim 7, wherein the bonding comprises using at least one pressure roller in surface contact with the chip substrate and at least one heat roller in contact with each transferred element to bond the transferred elements onto the chip substrate.

10. A method for assembling integrated circuits comprising:
    forming one or more spaced IC elements on an oxide layer, the oxide layer formed on a silicon substrate;
    coupling an intermediate transfer member onto a first surface of the one or more spaced IC elements;
    removing the silicon substrate by etching away the oxide layer and exposing a second surface of the one or more spaced IC elements, wherein the second surface is substantially parallel to the first surface;

coupling a phase change surface of a release member onto the exposed second surface of the one or more spaced IC elements;

removing the intermediate transfer member from the first surface of the one or more spaced IC elements; and exposing the coupled phase change material to an energy for selectively releasing the one or more spaced IC elements from the release member.

11. The method of claim 10, wherein the intermediate transfer member is flexible.

12. The method of claim 10, wherein the intermediate transfer member comprises a roll-to-roll material.

13. The method of claim 10, wherein the release member comprises a roll-to-roll material.

* * * * *